(12) United States Patent
Tsai et al.

(10) Patent No.: US 7,284,216 B2
(45) Date of Patent: Oct. 16, 2007

(54) SYSTEM AND METHOD FOR VERIFYING SIGNAL PROPAGATION DELAYS OF CIRCUIT TRACES OF A PCB LAYOUT

(75) Inventors: Hung-Yuan Tsai, Tu-Cheng (TW); Mo-Ying Tong, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 372 days.

(21) Appl. No.: 10/977,635

(22) Filed: Oct. 29, 2004

(65) Prior Publication Data

US 2005/0229129 A1    Oct. 13, 2005

(30) Foreign Application Priority Data

Jun. 4, 2004    (TW) .............................. 93116216 A

(51) Int. Cl.
   G06F 9/45      (2006.01)
   G06F 9/455     (2006.01)
   H03H 11/26     (2006.01)

(52) U.S. Cl. ................. 716/6; 716/1; 716/2; 716/4; 716/5; 716/9; 716/11; 327/277

(58) Field of Classification Search ............. 716/2, 716/6, 9, 11; 327/277; 257/678
   See application file for complete search history.

(56) References Cited

U.S. PATENT DOCUMENTS

| | | | |
|---|---|---|---|
| 5,610,833 A * | 3/1997 | Chang et al. ................. 716/11 |
| 6,316,944 B1 | 11/2001 | Barnette et al. ............ 324/617 |
| 6,349,402 B1 * | 2/2002 | Lin .............................. 716/2 |
| 6,415,426 B1 * | 7/2002 | Chang et al. .................. 716/9 |
| 6,696,875 B1 * | 2/2004 | Arkas et al. ................ 327/277 |
| 6,718,529 B1 | 4/2004 | Iwanishi ........................ 716/6 |
| 7,061,931 B2 * | 6/2006 | Voloshin et al. ............ 370/438 |
| 2004/0135613 A1 * | 7/2004 | Arkas et al. ................ 327/277 |
| 2004/0207064 A1 * | 10/2004 | Brooks et al. .............. 257/678 |
| 2006/0221686 A1 * | 10/2006 | Devadas et al. ....... 365/185.03 |

* cited by examiner

*Primary Examiner*—Jack Chiang
*Assistant Examiner*—Helen Rossoshek
(74) *Attorney, Agent, or Firm*—Morris Manning Martin LLP; Tim Tingkang Xia, Esq.

(57) ABSTRACT

A system for verifying signal propagation delays of circuit traces of a printed circuit board (PCB) layout includes a computer (1). The computer includes: a setting module (10) for setting a minimum propagation delay and a maximum propagation delay for a trace to be verified, and making a selection regarding whether to calculate a propagation delay of a lead wire connected with the trace; a selecting module (11) for selecting a segment from a segment set of the trace; a calculating module (12) for calculating a propagation delay of the segment, the trace and the lead wire, and a total propagation delay; and a determining module (13) for determining whether all segments of the trace have been calculated, and whether the total propagation delay is between the minimum propagation delay and the maximum propagation delay. A related method is also disclosed.

8 Claims, 3 Drawing Sheets

SYSTEM AND METHOD FOR VERIFYING SIGNAL PROPAGATION DELAYS OF CIRCUIT TRACES OF A PCB LAYOUT

BACKGROUND OF THE INVENTION

1. Field of the Invention

The present invention relates to systems and methods of verifying signal propagation delays in electronic equipment, and particularly to a system and method for verifying propagation delays of circuit traces of a printed circuit board (PCB) layout.

2. Related Art of the Invention

A PCB of a typical computer connects chip devices together, and also connects the chip devices to external components such as a keyboard and storage devices. The PCB generally utilizes circuit traces thereof to fulfill the connections. Some chip devices have multiple traces that send and/or receive data bits substantially simultaneously. The time that it takes for data to traverse a trace is known as propagation delay.

Computer chip sizes are continuing to be miniaturized, and electrical signals are being clocked at ever increasing frequencies. Even more that previously, high-speed, high-frequency signals being driven between chips via traces on a PCB are liable to detrimental impedance effects. One manifestation of these impedance effects is unwanted reflections due to impedance mismatches. The high-speed, high-frequency signals may also be prone to cross-talk and electromagnetic interference (EMI).

EMI is an electrical disturbance in an electronics-based system. EMI can be caused by natural phenomena such as lightning, by low-frequency waves emitted from electromechanical devices such as motors, or by high-frequency waves emitted from integrated circuits and other electronic devices such as routers.

The distance between two adjacent traces, trace width, and trace length on a PCB are parameters affecting EMI emissions and propagation delays. In particular, the shorter the distance between adjacent traces, the more intense the EMI emissions are. The wider the trace, the more intense the EMI emissions are. The longer the trace, the more intense the EMI emissions are. Furthermore, EMI emissions also generate propagation delay. If the propagation delay is very long, the speed of transmission of signals in the traces is slow, and the performance and quality of the PCB may be unsatisfactory. Indeed, there are legal requirements as to propagation delay which apply in many countries in which PCBs are marketed. Therefore, when constructing a PCB layout, it is necessary to verify propagation delay to insure that the propagation delay meets the requirements that apply in relevant countries in which the PCB is marketed. Additionally, such verification should be performed before the final physical layout of the PCB is determined, in order to avoid or minimize the difficult and expensive process of rectifying a layout.

Accordingly, there is a need for a system and method for verifying propagation delay of a PCB layout, in which verification is fast and inexpensive, and can be performed as early as possible in the design process.

SUMMARY OF THE INVENTION

A main objective of the present invention is to provide a system and method which can effectively calculate and verify signal propagation delays of circuit traces of a PCB layout.

To accomplish the above objective, a system for verifying signal propagation delays of circuit traces of a PCB layout in accordance with a preferred embodiment of the present invention comprises: a database for storing information on traces, and information on lead wires of a package encapsulating electronic components on the PCB; and a computer connected to the database, for calculating and verifying signal propagation delays of the circuit traces of the PCB. The computer comprises a setting module, a selecting module, a calculating module, a determining module, and an outputting module.

The setting module is for setting a minimum propagation delay and a maximum propagation delay for a trace to be verified, and making a selection regarding whether to calculate a propagation delay of a lead wire connected with the trace. The selecting module is for selecting a segment from a segment set of the selected trace. The calculating module is for calculating a length of the selected segment and a propagation delay of the selected segment, calculating a propagation delay of the trace and a propagation delay of the lead wire connected with the trace, and calculating a total propagation delay of the trace and the lead wire. The determining module is for determining whether all segments in the segment set have been selected, whether to calculate the propagation delay of the lead wire according to the selection made, and whether the total propagation delay is between the minimum propagation delay and the maximum propagation delay. The outputting module is for displaying design rule check (DRC) information if the total propagation delay is not between the minimum propagation delay and the maximum propagation delay.

Further, the present invention provides a method for verifying signal propagation delays of circuit traces of a PCB layout, the method comprising the steps of: (a) setting a minimum propagation delay and a maximum propagation delay for a trace to be verified, and making a selection regarding whether to calculate a propagation delay of a lead wire, the lead wire being part of a package encapsulating electronic components on the PCB; (b) calculating a propagation delay of the trace; (c) determining whether it is necessary to calculate a propagation delay of the lead wire based on the selection made; (d) treating the propagation delay of the trace as being the total propagation delay, if it is not necessary to calculate the propagation delay of the lead wire; (e) calculating the propagation delay of the lead wire if it is necessary to calculate the propagation delay of the lead wire; (f) adding the propagation delay of the lead wire to the propagation delay of the trace, to obtain a total propagation delay; (g) determining whether the total propagation delay is between the minimum propagation delay and the maximum propagation delay; and (h) displaying design rule check (DRC) information if the total propagation delay is not between the minimum propagation delay and the maximum propagation delay.

Other objects, advantages and novel features of the present invention will be drawn from the following detailed description with reference to the attached drawings, in which:

DETAILED DESCRIPTION OF THE INVENTION

Figure 1:
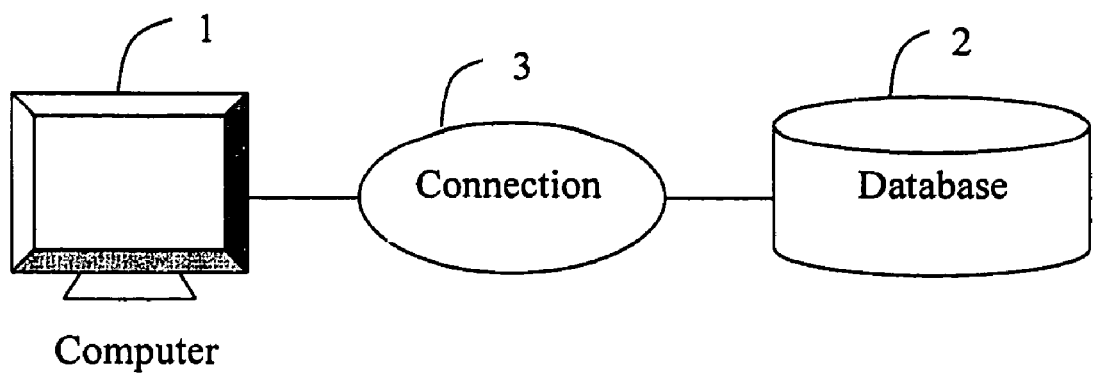
FIG. 1 is a schematic diagram of hardware infrastructure of a system for verifying signal propagation delays of circuit traces of a PCB layout in accordance with the preferred embodiment of the present invention.

FIG. 1 is a schematic diagram of hardware infrastructure of a system for verifying signal propagation delays of circuit traces of a printed circuit board (PCB) layout (hereinafter, "the system") in accordance with the preferred embodiment of the present invention. The system comprises a computer 1, a database 2, and a connection 3. The computer 1 contains a plurality of function modules installed therein (described in detail below in relation to FIG. 2). The computer 1 calculates and verifies a signal propagation delay of each trace of the PCB in order to determine whether the PCB layout is satisfactory. Generally, there are a plurality of traces in the PCB. Each trace includes a plurality of segments, which can be included in a segment set. That is, each trace corresponds to a segment set. Electronic components are set on the PCB. Such electronic components comprise chip devices, a central processing unit (CPU), one or more memories, etc. The electronic components can be encapsulated by a package, which has a plurality of lead wires extending therefrom. Each lead wire is connected with a corresponding trace. The database 2 stores information on the traces of the PCB layout, and information on lead wires of the package. Information on each trace includes a trace ID, segments of the trace, a type and detailed information on each segment, and a signal transmitting speed in the PCB (symbolically designated as $V_1$). Information on each lead wire includes a signal transmitting speed thereof in the package (symbolically designated as $V_2$), and a length of the lead wire (symbolically designated as $S_2$). A segment may be either a line or an arc. If a segment is a line, detailed information on the segment includes start and end coordinates of the segment. If a segment is an arc, detailed information on the segment includes a radian, a radius, and coordinates of a center of an imaginary circle of which the segment forms a part. The connection 3 is a database connectivity such as an open database connectivity (ODBC) or a Java database connectivity (JDBC), and connects the computer 1 to the database 2.

Figure 2:
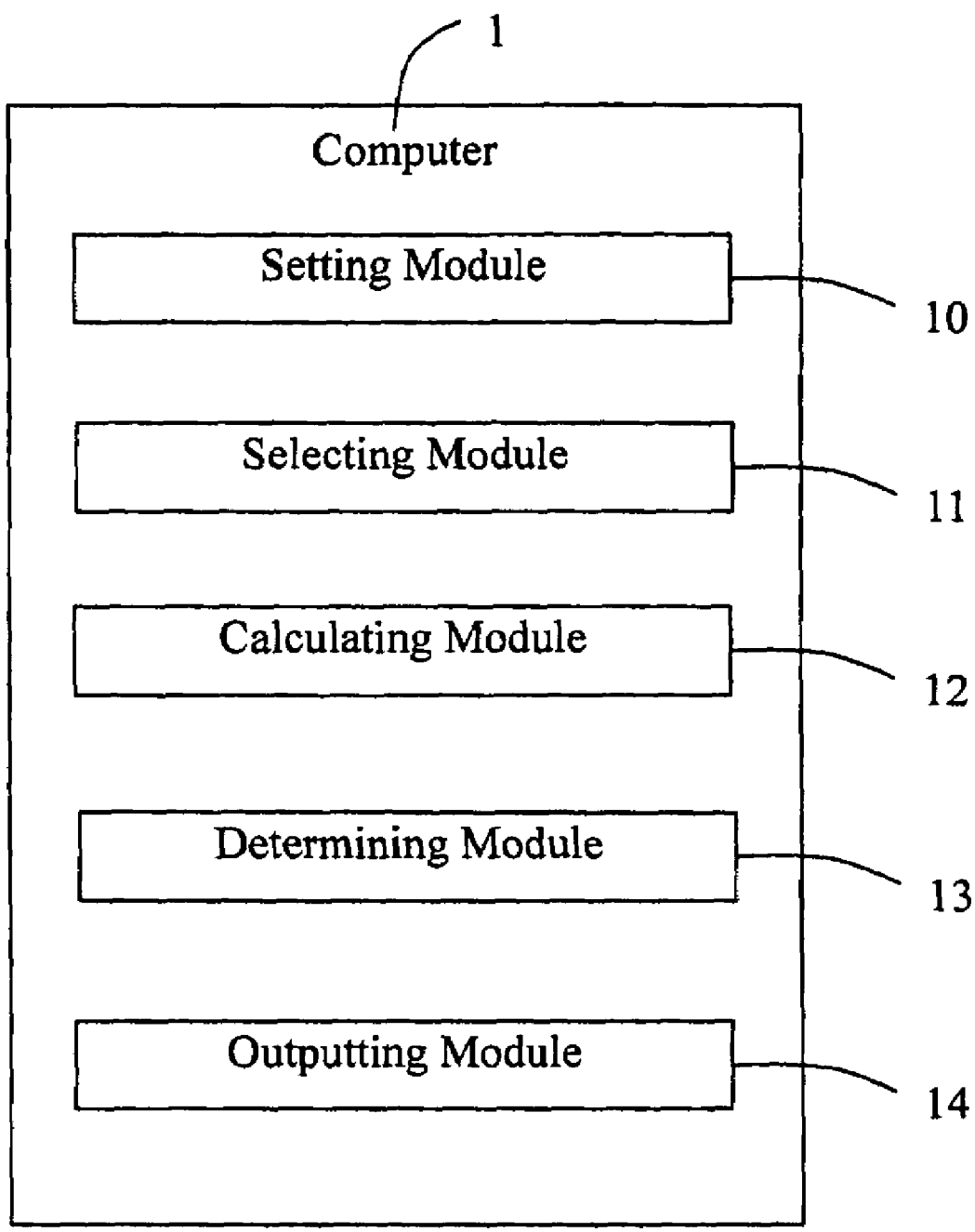
FIG. 2 is a schematic diagram of main function modules of a computer of the system of FIG. 1.

FIG. 2 is a schematic diagram of main function modules of the computer 1. The computer 1 comprises a setting module 10, a selecting module 11, a calculating module 12, a determining module 13, and an outputting module 14. The setting module 10 sets a minimum propagation delay and a maximum propagation delay for a trace to be verified, and makes a selection regarding whether to calculate a propagation delay of a corresponding lead wire of the package connected with the trace. The minimum propagation delay and the maximum propagation delay can be set according to any PCB layout design guideline. The selecting module 11 selects a segment from a segment set of the selected trace according to segment IDs. The calculating module 12 calculates a length of the selected segment and a propagation delay of the selected segment, and calculates a propagation delay of the trace by adding propagation delays of all segments of the trace. The calculating module 102 can also calculate a propagation delay of the lead wire connected with the trace, and obtain a total propagation delay by adding the propagation delays of the lead wire and the trace. The determining module 13 determines whether all segments in the segment set of the trace have been calculated as above, and whether to calculate the propagation delay of the lead wire connected with the trace according to the selection made through the setting module 10. The determining module 13 can further determine whether the total propagation delay is between the minimum propagation delay and the maximum propagation delay. If the total propagation delay is not between the minimum propagation delay and the maximum propagation delay, the outputting module 14 displays design rule check (DRC) information, indicating that the selected trace does not meet corresponding design rules.

Figure 3:
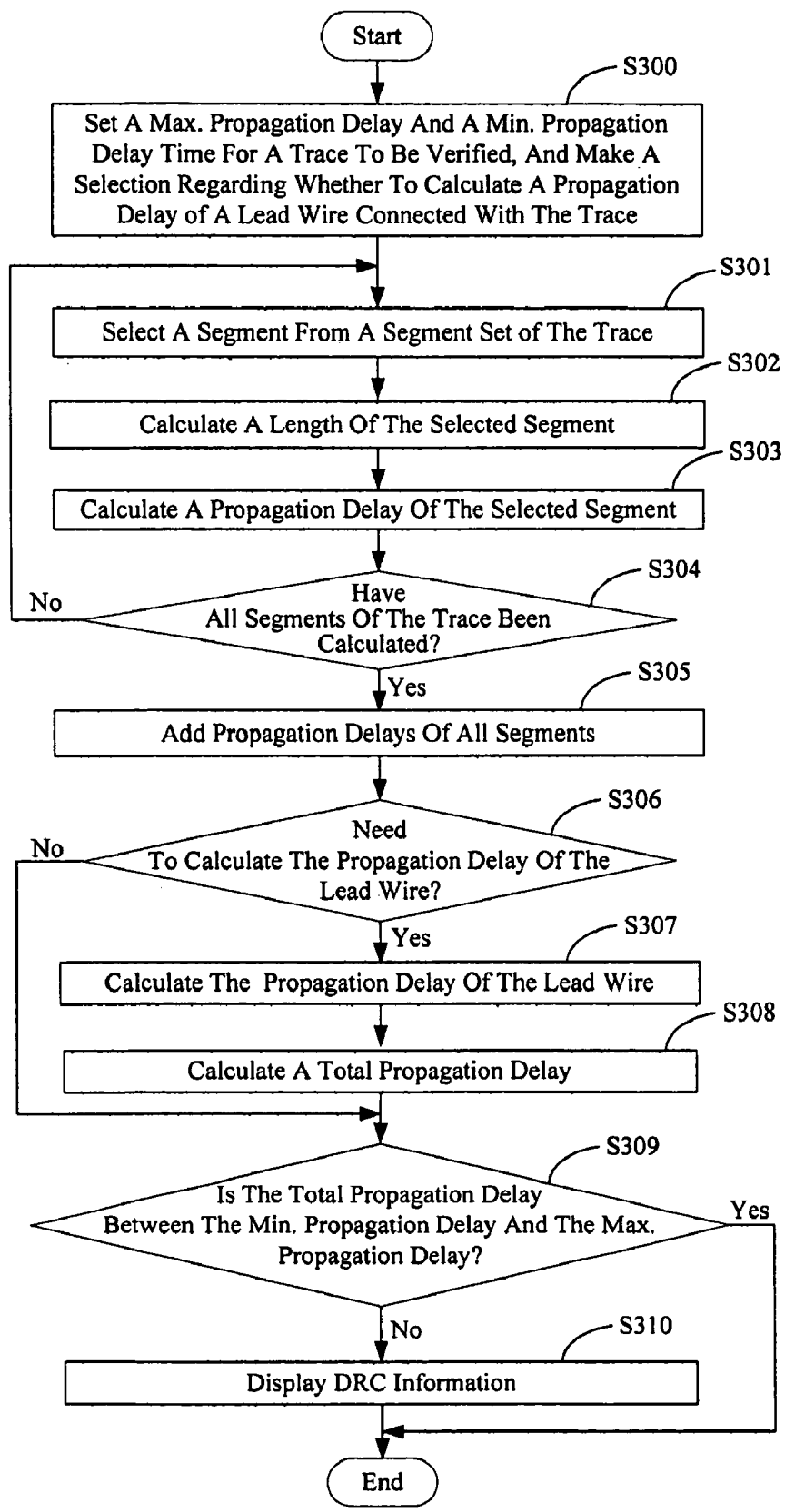
FIG. 3 is a flowchart of a preferred method for implementing the system of FIG. 1.

FIG. 3 is a flowchart of a preferred method for implementing the system. In step S300, the setting module 10 sets a minimum propagation delay and a maximum propagation delay for a trace to be verified, and makes a selection regarding whether to calculate a propagation delay of a lead wire of a package connected with the trace. In step S301, the selecting module 11 selects a segment from a segment set of the trace. In step S302, the calculating module 12 employs a particular calculating function according to a type of the selected segment, such as an Allegro calculating function, to calculate a length of the selected segment. Allegro is a PCB design software tool with a strong function library, and is available from Cadence Design Systems Inc. For example, when the selected segment is a line, the calculating function is a function1 designated as Clinelength( ). Clinelength( ) includes input parameters; namely, the start and end coordinates of the segment. When the selected segment is an arc, the calculating function is a function2 designated as Carclength( ). Carclength( ) includes input parameters; namely, a radian, a radius, and coordinates of a center of an imaginary circle of which the segment forms a part. In step S303, the calculating module 12 calculates a propagation delay of the selected segment according to the formula: $T=S_1/V_1$, wherein $S_1$ is a length of the selected segment, and $V_1$ is the signal transmitting speed of the trace in the PCB. In step S304, the determining module 13 determines whether all segments of the trace have been calculated as above. If there are any segments of the trace that have not been calculated, the procedure returns to step S301 described above. In contrast, if all segments of the trace have been calculated, in step S305, the calculating module 12 adds propagation delays of all segments in the selected trace to obtain a propagation delay of the trace. In step S306, the determining module 13 determines whether it is necessary to calculate the propagation delay of the lead wire connected with the selected trace, based on the selection made through the setting module 10. If it is not necessary to calculate the propagation delay of the lead wire, the propagation delay of the trace is treated as a total propagation delay, and the procedure goes directly to step S309 described below. In contrast, if it is necessary to calculate the propagation delay of the lead wire, in step S307, the calculating module 12 calculates the propagation delay of the lead wire according to the formula: $T=S_2/V_2$, wherein $S_2$ is the length of the lead wire, and $V_2$ is the signal transmitting speed of the lead wire in the package. In step S308, the calculating module 12 adds the propagation delay of the lead wire to the propagation delay of the trace, to obtain a total propagation delay. In step S309, the determining module 13 determines whether the total propagation delay is between the minimum propagation delay and maximum propagation delay. If the total propagation delay is between the minimum propagation delay and the maximum propagation delay, the procedure is ended. Otherwise, if the total propagation delay is not between the minimum propagation delay and maximum propagation delay, in step S310, the outputting module 14 displays design rule check (CRC) information, indicating that the trace does not meet corresponding design rules, whereupon the procedure is ended.

Although the present invention has been specifically described on the basis of a preferred embodiment and preferred method, the invention is not to be construed as being limited thereto. Various changes or modifications may be made to the embodiment and methods without departing from the scope and spirit of the invention.

What is claimed is:

1. A system for verifying signal propagation delays of circuit traces of a printed circuit board (PCB) layout, comprising:
   a database for storing information on the circuit traces;
   a computer connected to the database, for calculating and verifying signal propagation delays of the circuit traces, the computer comprising:
   a setting module for setting a minimum propagation delay and a maximum propagation delay for a trace to be verified, and making a selection regarding whether to calculate a propagation delay of a lead wire connected with the trace, the lead wire being part of a package encapsulating electronic components on the PCB;
   a selecting module for selecting a segment from a segment set of the trace thereby yielding a selected segment;
   a calculating module for calculating a length of the selected segment by utilizing a calculating function according to a type of the selected segment, calculating a propagation delay of the selected segment according to the length thereof, calculating a propagation delay of the trace by summing the propagation delays of all segments of the trace, calculating a propagation delay of the lead wire of the package connected with the trace, and calculating a total propagation delay by summing the propagation delays of the trace and the lead wire; and
   a determining module for determining whether all segments in the segment set have been calculated, determining whether to calculate the propagation delay of the lead wire connected with the trace according to the selection made, and determining whether the total propagation delay lies in a range between the minimum propagation delay and the maximum propagation delay.

2. The system as described in claim 1, further comprising an outputting module for displaying design rule check (DRC) information if the total propagation delay does not lie in the range between the minimum propagation delay and the maximum propagation delay.

3. A computer-based method for verifying signal propagation delays of circuit traces of a printed circuit board (PCB) layout, the method comprising the steps of:
   setting a minimum propagation delay and a maximum propagation delay for a trace to be verified, and making a selection regarding whether to calculate a propagation delay of a lead wire connected with the trace, the lead wire being part of a package encapsulating electronic components on the PCB;
   selecting a segment from a segment set of the trace, thereby yielding a selected segment;
   calculating a length of the selected segment by utilizing a calculating function according to a type of the selected segment;
   calculating a propagation delay of the selected segment according to the length thereof;
   determining whether all segments of the selected trace have been calculated;
   calculating a propagation delay of the trace by summing the propagation delays of all segments of the trace if all segments of the trace have been calculated;
   determining whether it is necessary to calculate a propagation delay of the lead wire based on the selection made;
   calculating the propagation delay of the lead wire if it is necessary to calculate the propagation delay of the lead wire;
   summing the propagation delay of the lead wire and the propagation delay of the trace, to obtain a total propagation delay;
   determining whether the total propagation delay lies in a range between the minimum propagation delay and the maximum propagation delay; and
   displaying design rule check (DRC) information if the total propagation delay does not lie in the range between the minimum propagation delay and the maximum propagation delay.

4. The method as described in claim 3, wherein the DRC information indicates that the trace does not meet corresponding design rules.

5. The method as described in claim 3, wherein the step of calculating a propagation delay of the trace further comprises the step of: returning to the step of selecting a segment from the segment set of the trace, if any of the segments of the trace have not been calculated.

6. The method as described in claim 3, further comprising the step of treating the propagation delay of the trace as being the total propagation delay, if it is not necessary to calculate the propagation delay of the lead wire.

7. A method for verifying signal propagation delays of a trace layout of a circuit board, comprising the steps of:
   acquiring or selecting a minimum propagation delay value, a maximum propagation delay value, and a range between said minimum and maximum propagation delay values;
   detecting and determining a propagation delay value of a selective trace of said trace layout;
   detecting and determining a propagation delay value of a lead wire of an electronic component on said circuit board connected with said selective trace;
   summing said propagation delay value of said lead wire and said propagation delay value of said selective trace, in order to obtain a total propagation delay value; and
   reporting said selective trace in case that said total propagation delay value is out of said range between said minimum and maximum propagation delay values.

8. The method as described in claim 7, wherein said selective trace is represented by a set of segments and said propagation delay value of said selective trace is a total of a propagation delay value of each of said set of segments.

* * * * *